United States Patent [19]

Candelaria

[11] Patent Number: 5,441,901
[45] Date of Patent: Aug. 15, 1995

[54] METHOD FOR FORMING A CARBON DOPED SILICON SEMICONDUCTOR DEVICE HAVING A NARROWED BANDGAP CHARACTERISTIC

[75] Inventor: Jon J. Candelaria, Tempe, Ariz.

[73] Assignee: Motorola, Inc., Schaumburg, Ill.

[21] Appl. No.: 257,972

[22] Filed: Jun. 10, 1994

Related U.S. Application Data

[62] Division of Ser. No. 131,541, Oct. 5, 1993, Pat. No. 5,360,986.

[51] Int. Cl.⁶ .......................................... H01L 21/331
[52] U.S. Cl. ................................. 437/31; 437/126; 437/133; 437/162
[58] Field of Search ............... 437/31, 126, 133, 22, 437/23, 24, 25, 28, 162

[56] References Cited

U.S. PATENT DOCUMENTS

| | | | |
|---|---|---|---|
| 4,885,614 | 12/1989 | Furukawa et al. | 257/197 |
| 5,212,101 | 5/1993 | Canham et al. | 437/24 |
| 5,323,031 | 6/1994 | Shoji et al. | 257/198 |

Primary Examiner—Brian E. Hearn
Assistant Examiner—Tuan Nguyen
Attorney, Agent, or Firm—Kevin B. Jackson

[57] ABSTRACT

A IV-IV semiconductor device having a narrowed bandgap characteristic compared to silicon and method is provided. By incorporating carbon into silicon at a substitutional concentration of between 0.5% and 1.1%, a semiconductor device having a narrowed bandgap compared to silicon and good crystalline quality is achieved. The semiconductor device is suitable for semiconductor heterojunction devices that use narrowed bandgap regions.

21 Claims, 2 Drawing Sheets

METHOD FOR FORMING A CARBON DOPED SILICON SEMICONDUCTOR DEVICE HAVING A NARROWED BANDGAP CHARACTERISTIC this is a division of application Ser. No. 08/131,541, filed Oct. 5, 1993 now U.S. Pat. No. 5,360,986.

BACKGROUND OF THE INVENTION

This invention relates, in general, to heterojunction semiconductor devices, and more particularly, to semiconductor devices comprising silicon and carbon doped silicon.

Semiconductor heterojunction devices comprising at least two Group IV elements, silicon, germanium, and carbon, have been widely reported. In particular applications, heterojunction devices using Group IV elements are preferable over heterojunction devices using Group III and Group V elements for example, because heterojunction devices comprised of Group IV elements are more cost effective.

Carbon doped silicon devices have been widely reported. Carbon typically has been added to silicon in a variety of ways to provide a widened bandgap compared to silicon. A designer may vary the bandgap width by varying the concentration of the carbon in the carbon doped silicon material. Carbon has been added to silicon to form widened bandgap emitter regions in HBT devices. Silicon carbide is a widely used form of heavily carbon doped (>40% carbon) silicon and has a bandgap of 2.2 eV to 3.3 eV compared to silicon's bandgap of 1.12 eV at 25° C. Silicon carbide has been used to make wide bandgap field effect transistor devices that are more thermally, chemically, and mechanically stable than silicon devices and are more resistant to radiation damage than silicon devices.

Germanium-carbon doped silicon devices also have been reported. For example, germanium-carbon doped silicon also has been used for widened bandgap emitter regions in HBT devices. Germanium-carbon doped silicon devices have a disadvantage in that the concentrations of two elements, germanium and carbon, must be controlled in order to provide a quality semiconductor layer.

Germanium doped silicon devices also have been reported. Germanium has been added to silicon to provide a narrowed bandgap compared to silicon. However, germanium doped silicon layers have several disadvantages. For example, in order for a sufficient narrowing to occur in the bandgap, relatively high concentrations, typically greater than 8% germanium, must be used. Since high concentrations of germanium are necessary to achieve bandgap narrowing, germanium doped silicon devices are susceptible to crystalline defects such as misfit dislocations. These crystalline defects severely limit the ability to produce narrowed bandgap devices.

Furthermore, the processes used to manufacture germanium doped silicon layers are costly. Chemical vapor deposition (CVD) techniques, such as molecular beam epitaxial deposition or conventional epitaxial deposition, typically are used to form the germanium doped silicon layers. These CVD techniques require significant capital investment and offer poor processing throughput. Also, using CVD techniques to selectively deposit germanium-doped silicon layers requires significant pre-deposition processing that adds to manufacturing costs. This increase in manufacturing cost limits the ability to integrate heterojunction devices with non-heterojunction devices within the same monolithic integrated circuit.

Although ion implantation has been used to dope silicon with germanium, large germanium implant doses are required to in order to achieve a narrowed bandgap characteristic. Large germanium implant doses require significant implanting time and result in significant damage to the silicon lattice making re-crystallization and defect reduction difficult.

Thus, there exists a need for a IV-IV semiconductor heterojunction device that has a narrowed bandgap compared to silicon, that uses relatively low concentrations of a group IV element to narrow the bandgap, that is less susceptible to defect formation, and that can be selectively formed using cost-effective manufacturing techniques.

SUMMARY OF THE INVENTION

Briefly stated, a carbon doped silicon semiconductor device having a narrowed bandgap characteristic compared to silicon is provided comprising a first crystalline semiconductor layer made substantially of silicon and a second crystalline semiconductor layer made substantially of carbon doped silicon. The first layer and the second layer form a heterojunction. Carbon is present in the carbon doped silicon layer at a substitutional concentration of between 0.5% and 1.1% carbon.

A method of making a carbon doped silicon semiconductor device is also provided. The method comprises the steps of providing a first semiconductor layer made substantially of silicon of a first conductivity type, forming a second semiconductor layer made substantially of silicon of a second conductivity type on the first semiconductor layer, incorporating carbon in the second semiconductor layer at a substitutional concentration of between 0.5% and 1.1%, and forming a third semiconductor layer made substantially of silicon of the first conductivity type on the second semiconductor layer. The first semiconductor layer forms a collector region, the second semiconductor layer forms a base region, and the third semiconductor layer forms an emitter region.

DETAILED DESCRIPTION OF THE DRAWINGS

Figure 1:
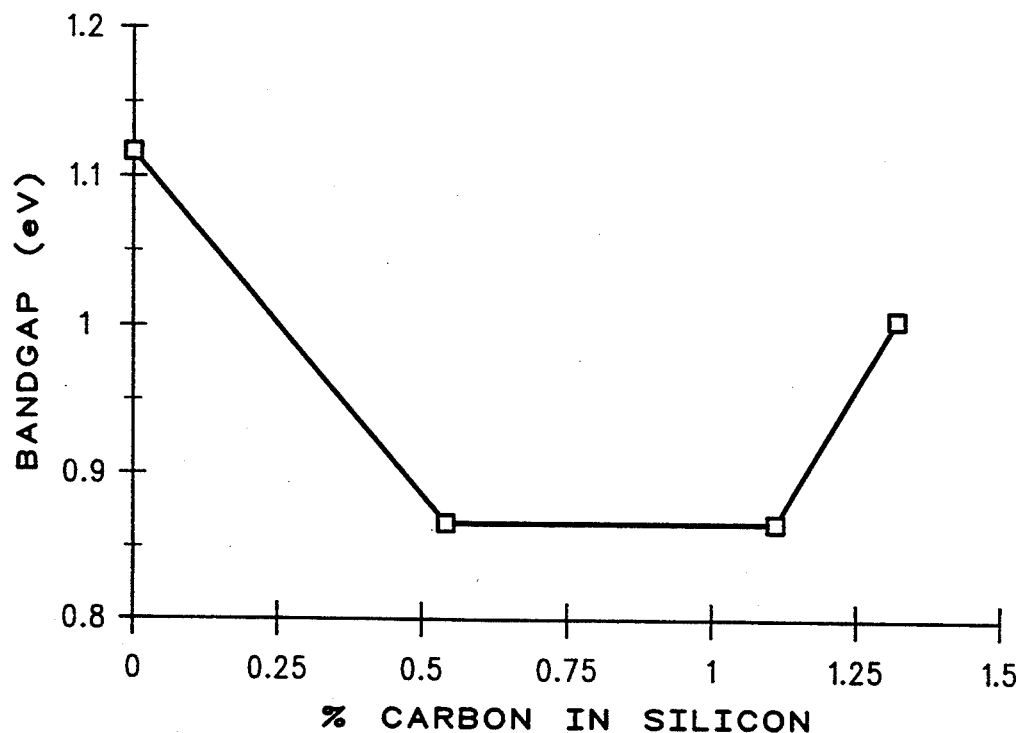
FIG. 1 is a plot of bandgap as a function of composition for low levels of carbon in carbon doped silicon according to the present invention.

Generally, the present invention provides a IV-IV semiconductor heterojunction device and method using carbon doped silicon to produce a narrowed bandgap compared to silicon. Theoretical studies using computer modeling techniques have shown that at small to moderate carbon concentrations (greater than 1.6% carbon), carbon doped silicon should exhibit a decrease in bandgap compared to pure silicon, if the carbon is kept within substitutional lattice sites. Demkov, Alexander et al., *Theoretical Investigation of Random Si—C Alloys*, Physical Review B, 48, 2207 (1993).

It is believed that a bandgap narrowing characteristic occurs because of the difference in the covalent radii between carbon and silicon (3.57 Å for carbon, and 5.43 Å for silicon). When carbon is substitutionally present in the silicon lattice, the difference in the covalent radii results in a strained lattice around the carbon atoms. The presence of the strain eliminates the degeneracy of energy levels associated with unstrained silicon, and thus reduces the bandgap. For strain to occur, which results in bandgap narrowing, carbon must be incorporated substitutionally into the silicon lattice.

The present invention can be more fully described with reference to FIGS. 1 and 2. As is evident in FIG. 1, when small concentrations of carbon (<1.5% carbon) are present in silicon, a bandgap narrowing characteristic is observed. To achieve the bandgap narrowing characteristic shown in FIG. 1, diode devices were manufactured using conventional semiconductor processing techniques. FIG. 2 is an enlarged cross sectional view of a diode device 21. Diode device 21 is comprised of a p-type silicon substrate 22, carbon doped silicon region 23, n-type region 24, n-type polysilicon layer 29, cathode metal contact 31, and anode metal contact 32. Diode device 21 is passivated using conventional passivation layers, such as oxide layer 26, nitride layer 27, and oxide layer 28 for example.

A plurality of diode devices 21 are constructed on several p-type <100> silicon substrates 22 having a boron dopant concentration of approximately 2.0E17 atoms/cm$^3$. Substrate 22 is passivated using, for example, oxide layer 26, nitride layer 27, and oxide layer 28. Oxide layer 26 is approximately 400 Å of grown oxide, nitride layer 27 is approximately 1000 Å of deposited nitride, and oxide layer 28 is approximately 2000 Å of deposited oxide. Conventional photolithography and etching techniques are used to etch an opening through oxide layer 28 and nitride layer 27, but leaving oxide layer 26 unetched. Carbon is then ion implanted into substrate 22 through oxide layer 26 into substrate 22. The ion implantation doses for carbon are 3.5E15, 7.0E15, and 8.75E15 atoms/cm$^2$ and the implant energy is 25 keV. To prevent carbon channeling in the silicon lattice, substrate 22 is maintained at approximately 7° relative to the incident ion beam direction during carbon implantation.

Oxide layer 26 is then etched from the opening and substrate 22 receives a post-amorphization implant comprising a silicon ($^{29}$Si+) implant at a dose of approximately 4.0E15 atoms/cm$^2$ and an implant energy of 25 keV. The post-amorphization implant is optional but preferred because the post-amorphization implant provides a greater bandgap narrowing. Next, substrate 22 receives a 700° C. anneal in an inert ambient, such as N$_2$, for 30 minutes to induce solid phase epitaxial (SPE) regrowth of the ion implanted region to form carbon doped silicon region 23.

Next, undoped polysilicon is deposited using conventional chemical vapor deposition techniques onto substrate 22. Arsenic is then ion implanted at a dose of approximately 8.0E15 atoms/cm$^2$ and an implant energy of 60 keV into the undoped polysilicon layer. The polysilicon is then patterned using conventional photolithography and etching techniques. Substrate 22 then receives a 1000° C. rapid thermal anneal (RTA) for approximately 30 seconds to form n-type polysilicon layer 29 and n-type region 24. Diode 21 is finished using conventional processing techniques to form cathode contact 31 and anode contact 32.

Figure 2:
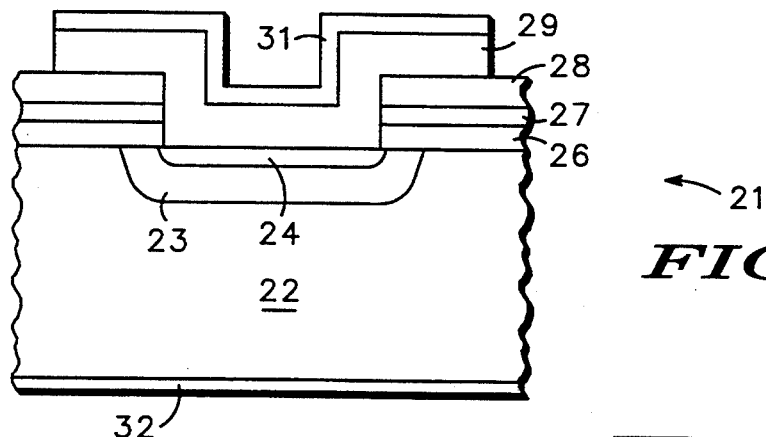
FIG. 2 is an enlarged view of the embodiment used to produce the bandgap data of FIG. 1.

Electrical data taken from the forward biased characteristics of diode device 21 is used to calculate the bandgap data in FIG. 1. After SPE and RTA processing, implant doses of 3.5E15, 7.0E15, and 8.75E15 atoms/cm$^2$ correspond to 0.53%, 1.10%, and 1.33% substitutional carbon concentration respectively. The bandgap data in FIG. 1 is for diode device 21 with a post-amorphization silicon implant. This data shows that the maximum bandgap narrowing occurs between 0.5% and 1.1% carbon.

As a comparison, to achieve an equivalent bandgap narrowing in germanium doped silicon devices, over 20% germanium is necessary. Since less carbon is needed to achieve the equivalent bandgap narrowing, the carbon doped silicon device is less susceptible to crystalline defects. Furthermore, the germanium implant dose necessary to achieve 20% germanium in silicon requires significant implantation time, thus impacting process throughput.

Figure 3:
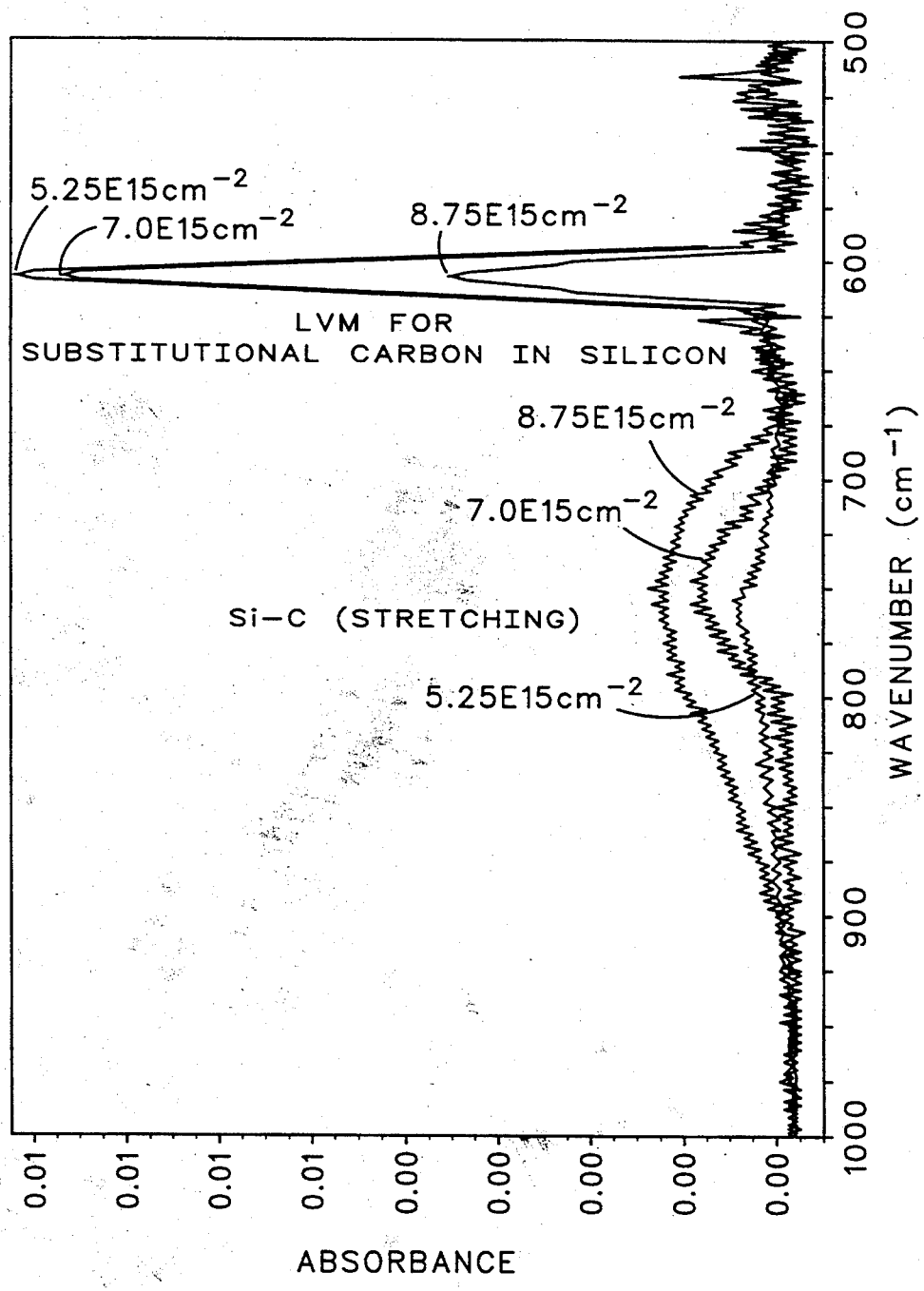
FIG. 3 is a transmission infra-red spectra plot for carbon doped silicon according to the present invention.

FIG. 3 shows a transmission infra-red spectra from substrates 22 receiving carbon implant doses of 5.25E15, 7.0E15, and 8.75E15 atoms/cm$^2$ and the post-amorphization silicon implant. The peak due to the local vibration mode (LVM) of substitutional carbon in silicon, located at 606–607 cm$^{-1}$, reaches a maximum at 5.25E15 atoms/cm$^2$, slightly decreases at 7.0E15 atoms/cm$^2$ and further decreases at 8.75E15 atoms/cm$^2$. The peak at approximately 750 cm$^{-1}$ increases as the carbon implant dose increases from 5.25E15 to 8.75E15 atoms/cm$^2$. The additional peak at 750 cm$^{-1}$ is assigned to the Si—C (stretching) vibration, which indicates that carbon precipitates to form silicon carbide. This data suggests that the maximum substitutional carbon incorporation occurs at a carbon implant dose of 5.25E15 atoms/cm2, which corresponds to approximately 0.8% carbon. Thus, the greatest lattice strain and bandgap narrowing occurs with carbon concentrations of approximately 0.8%. Furthermore, substrates 22 that receive carbon implant doses of up to 5.25E15 and the post-amorphization silicon implant show the best crystalline quality.

The carbon doped silicon structure having a narrowed bandgap according to the present invention can be used in semiconductor devices such as heterojunction bipolar transistor (HBT) devices. The narrowed bandgap carbon doped silicon is suitable for base regions of HBT devices.

Figure 4:
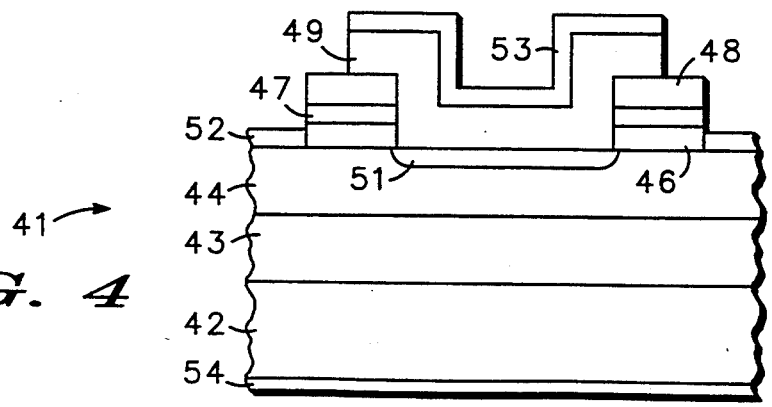
FIG. 4 is an enlarged sectional view of an embodiment of the present invention.

FIG. 4 shows an enlarged cross-sectional view of an HBT device 41 according to the present invention. HBT device 41 is comprised of n-type semiconductor substrate 42, having an n-type epitaxial layer that forms collector region 43. Narrowed bandgap base region 44 is a p-type epitaxial layer having carbon substitutionally incorporated at a concentration of between 0.5% to 1.1% carbon, with a concentration of 0.8% carbon preferred. HBT 41 is passivated using conventional passivation techniques. For example, HBT 41 is passivated with oxide layer 46, nitride layer 47, and oxide layer 48. N-type polysilicon layer 49 provides a dopant source for emitter region 51. Base contact 52, emitter contact 53, and collector contact 54 provide ohmic contacts to HBT 41.

HBT 41 having narrowed bandgap base region 44 together with the wider bandgap collector and emitter regions 43 and 51 provide a bipolar transistor that has improved device performance over conventional bipolar transistor devices. For example, because of its bandgap structure, HBT 41 allows for higher emitter efficiency, decreased base resistance, less emitter current crowding, wider frequency response, and wider temperature range of operation.

HBT 41 having narrowed bandgap base region 44 is manufactured as follows. Substrate 42 is an n-type substrate, preferably <100> orientation, doped with arsenic, for example, at a dopant concentration in excess of $1.0E18$ atoms/cm$^3$. Collector region 43 is an n-type layer that may be formed with conventional epitaxial growth techniques for example. Collector region 43 is doped with an n-type dopant such as arsenic at a dopant concentration on the order of $1.0E16$ to $1.0E18$ atoms/cm$^3$ and is on the order of 0.4 microns thick or greater, depending on the application.

To form narrowed bandgap base region 44, a p-type layer is formed with conventional epitaxial growth techniques for example, on collector 43. Base region 44 is doped with boron at a dopant concentration on the order of $1.0E18$ to $1.0E19$ atoms/cm$^3$ and is on the order of 0.08 microns thick. HBT 41 is then passivated with, for example, approximately 400 Å of oxide 46, followed by approximately 1000 Å of deposited nitride 47, followed by approximately 2000 Å of deposited oxide 48. The deposited oxide 48 and nitride 47 are patterned using conventional photolithography techniques and etched down to oxide layer 46 to form an opening. Oxide layer 46 is used to both passivate HBT 41 and form a screen oxide in the opening for carbon implantation.

To provide for the narrowed bandgap characteristic in base region 44, carbon is ion implanted through the opening and oxide layer 46 into base region 44 at a dosage range of between $3.0E15$ and $7.0E15$ atoms/cm$^2$, with a preferred dose of $5.25E15$ atoms/cm$^2$ and an implant energy of approximately 25 keV. Implant energy may be adjusted up or down depending upon the thickness of oxide layer 46. A carbon source such as carbon dioxide is suitable for the carbon implantation. To avoid channeling of the carbon ions in the silicon lattice, substrates 42 are maintained at approximately 7° relative to the incident ion beam direction during carbon implantation.

Although other techniques may be used to form carbon doped silicon base region 44, such as chemical vapor deposition or molecular beam epitaxy for example, carbon ion implantation is preferred because ion implantation offers excellent control of dopant concentration and good process throughput. In addition, ion implantation allows for selective carbon doping using minimal pre-implantation processing steps. For example, in monolithic integrated devices incorporating both heterojunction and non-heterojunction devices, a masking layer such as an oxide or a thick photoresist may used during ion implantation to provide selective carbon doping.

Following the carbon implant, oxide layer 46 is removed from the opening using, for example, a buffered HF acid. Next, silicon is implanted through the opening into base region 44 at a dosage of between $1.0E15$ and $1.0E16$ atoms/cm$^2$, with a dose of $4.0E15$ atoms/cm$^2$ preferred, and an implant energy of between 25 and 60 keV with an implant energy of 25 keV preferred. To provide for recrystallization of the silicon lattice and to incorporate the carbon substitutionally into the silicon lattice, substrate 42 is then subjected to a solid phase epitaxial regrowth process, which comprises a 700° C. anneal in an inert ambient, such as $N_2$, for approximately 30 minutes.

Next polysilicon layer 49 is deposited using conventional chemical vapor deposition techniques. Polysilicon layer 49 is on the order of 3000 Å thick and may be doped or undoped during deposition. If polysilicon layer 49 is undoped, an n-type dopant, preferably phosphorous, is then ion implanted into polysilicon layer 49. An implant dose of between $1.0E15$ and $1.0E16$ atoms/cm$^2$ may be used, with a dose of $8.0E15$ atoms/cm$^2$ preferred. An implant energy of between 20 and 60 keV may be used with an energy of 30 keV preferred. Polysilicon layer 49 is then etched using conventional techniques to form a desired pattern such as the pattern shown in FIG. 4. Substrate 42 is then annealed using, for example, a rapid thermal anneal system at 925° C. for 30 seconds. This anneal step allows phosphorous to diffuse out of polysilicon layer 49 into substrate 42 to form emitter region 51. After the anneal step, the phosphorous surface concentration at the interface of polysilicon layer 49 and emitter region 51 is approximately $1.0E19$ atoms/cm$^3$.

Deposited oxide 48, nitride layer 47, and oxide layer 46 are then patterned using conventional photolithography and etching techniques to form base contact openings. A contact metallization layer, such as platinum is then deposited using conventional metallization deposition techniques onto the top surface of substrate 42, annealed, and etched to form platinum silicide base contacts 52 and emitter contact 53. Contact metallization, such as gold, is then deposited using conventional metallization deposition techniques onto the bottom surface of substrate 42 to form collector contact 54 to complete HBT 41. Optionally, substrate 42 may be thinned using a backgrinding process for example, prior to depositing collector contact 54.

By now it should be appreciated that there has been provided a IV-IV heterojunction semiconductor device and method comprised of carbon doped silicon that has a narrowed bandgap characteristic compared to silicon. The carbon doped silicon heterojunction device uses low concentrations of carbon to narrow the bandgap and thus is less susceptible to crystalline defect formation. In addition, the heterojunction device may be formed using cost effective ion implantation and solid phase epitaxial regrowth process techniques. Furthermore, since ion implantation process techniques may be used to provide narrowed bandgap devices, the narrowed bandgap devices may be selectively integrated with non-heterojunction devices within the same monolithic integrated circuit in a cost effective manner.

I claim:

1. A method for making a heterojunction device comprising the steps of:
   providing a first layer made substantially of silicon of a first conductivity type;
   forming a second layer on the first layer, the second layer made substantially of silicon and a dopant substitutionally present in the second layer to provide a narrowed bandgap, wherein the second layer is of a second conductivity type, and wherein the dopant consists essentially of carbon present at a concentration less than 1.5%; and
   forming a third layer made substantially of silicon of the first conductivity type on the second layer, wherein the first layer forms a collector region, the second layer forms a base region, and the third layer forms an emitter region.

2. The method of claim 1 wherein the step of forming the second layer comprises the steps of:
   forming the second layer on the first layer;
   ion implanting carbon into the second layer at an ion implantation dose of between 3.5E15 and 7.0E15 atoms/cm$^2$; and
   heating the second layer in an inert ambient to induce solid phase epitaxial regrowth of the second layer to substitutionally incorporate carbon into the second layer.

3. The method of claim 2 further comprising the steps of:
   forming a screen oxide layer on the second layer before the step of ion implanting carbon; and
   ion implanting silicon into the second layer at ion implantation dose of between 1.0E15 to 1.0E16 atoms/cm$^2$ before the step of heating the second layer.

4. The method of claim 1 wherein the step of forming the third layer comprises the steps of:
   forming a polysilicon layer on the second layer;
   ion implanting an n-type dopant into the polysilicon layer; and
   annealing the polysilicon layer to diffuse n-type dopant in the polysilicon layer into the second layer to form the third layer.

5. The method of claim 1 wherein the step of forming the first layer comprises:
   forming the first layer having an n-type dopant concentration in a range from 1.0E16 to 1.0E18 atoms/cm$^3$.

6. The method of claim 1 wherein the step of forming the second layer comprises:
   forming the second layer having a boron concentration in a range from 1.0E18 to 1.0E19 atoms/cm$^3$.

7. A process for forming a carbon doped silicon semiconductor device having a narrowed bandgap characteristic comprising the steps of:
   providing a first crystalline semiconductor layer made substantially of silicon and having a first surface; and
   forming a second crystalline semiconductor layer on the first surface, wherein the second crystalline semiconductor layer is made substantially of silicon and a dopant to provide a narrowed bandgap, wherein the dopant that provides the narrowed bandgap consists essentially of carbon, and wherein carbon is present in the second crystalline semiconductor layer at a substitutional concentration of less than 1.5%, and wherein the first and second crystalline semiconductor layers form a first heterojunction.

8. The process of claim 7 wherein the step of forming the second crystalline semiconductor layer comprises:
   forming the second crystalline semiconductor layer made substantially of silicon on the first surface;
   ion implanting carbon into the second crystalline semiconductor layer at a carbon implant dose up to 7.0E15 atoms/cm$^2$; and
   annealing the second crystalline semiconductor layer in an inert atmosphere to generate solid phase epitaxial regrowth of the second crystalline semiconductor layer to substitutionally integrate carbon into the second crystalline semiconductor layer.

9. The process of claim 8 further comprising the steps of:
   forming a thin oxide before the step of ion implanting carbon; and
   ion implanting silicon into the second crystalline semiconductor layer at an ion implant dose between 1.0E15 and 1.0E16 atoms/cm$^2$ before the step of annealing the second crystalline semiconductor layer.

10. The process of claim 7 wherein the step of forming the second crystalline semiconductor layer comprises forming the second crystalline semiconductor layer in a chemical vapor deposition reactor.

11. The process of claim 7 wherein the step of forming the second crystalline semiconductor layer comprises forming the second crystalline semiconductor layer with molecular beam epitaxy.

12. The method of claim 7 wherein the step of providing the first crystalline semiconductor layer includes providing a first crystalline semiconductor layer having a first conductivity type, and wherein the step of forming the second crystalline semiconductor layer includes forming a second crystalline semiconductor layer having a second conductivity type, wherein the second conductivity type is different than the first conductivity type.

13. The method of claim 12 further comprising the steps of:
   forming a third crystalline semiconductor layer made substantially of silicon, wherein the third crystalline semiconductor layer is of the first conductivity type, and wherein the third crystalline semiconductor layer and the second crystalline semiconductor layer form a second heterojunction;
   forming a first ohmic contact on the first crystalline semiconductor layer to form a collector contact;
   forming a second ohmic contact on the second crystalline semiconductor layer to form a base contact; and
   forming a third ohmic contact on the third crystalline semiconductor layer to form an emitter contact, wherein the first, second, and third crystalline semiconductor layers form a heterojunction bipolar transistor.

14. A process for forming a heterojunction bipolar device comprising the steps of:
   forming a first semiconductor layer of a first conductivity type on a semiconductor substrate of the first conductivity type, wherein the first semiconductor layer is made substantially of silicon and forms a collector region;
   forming a second semiconductor layer of a second conductivity type, opposite the first conductivity type, on the first semiconductor layer, wherein the second semiconductor layer is made substantially of silicon and a dopant to provide a narrowed bandgap compared to silicon, and wherein the dopant that provides the narrowed bandgap consists essentially of carbon, and wherein the carbon is present in the second semiconductor layer at a substitutional concentration between 0.5% and 1.1%, and wherein the second semiconductor layer forms a base region; and
   forming a third semiconductor layer on at least a portion of the second semiconductor layer, wherein the third semiconductor layer is made substantially of silicon and doped in the first conductivity type to form an emitter region.

15. The process of claim 14 wherein the step of forming the second semiconductor layer includes forming the second semiconductor layer with carbon present in the second semiconductor layer at a substitutional concentration of approximately 0.8%.

16. The process of claim 14 wherein the step of forming the second semiconductor layer comprises:

forming the second semiconductor layer having an upper surface on the first semiconductor layer;

implanting carbon into the upper surface at a implant dosage between 3.5E15 and 7.0E15 atoms/cm$^2$; and exposing the second semiconductor layer to an elevated temperature and an inert ambient to provide solid phase epitaxial regrowth of the second semiconductor layer to substitutionally incorporate carbon into the second semiconductor layer.

17. The process of claim 16 wherein the step of exposing the second semiconductor layer to the elevated temperature includes exposing the second semiconductor layer to a temperature of approximately 700° C. for approximately 30 minutes in a nitrogen ambient.

18. The process of claim 16 further comprising the step of implanting silicon into the upper surface of the second semiconductor layer at an implant dose between 1.0E15 and 1.0E16 atoms/cm$^2$ before the step of exposing the second semiconductor layer to the elevated temperature.

19. The process of claim 14 further comprising the steps of:

forming a first metallization contact on a portion of the second semiconductor layer to form a base contact;

forming a second metallization contact on the third semiconductor layer to form an emitter contact; and forming a third metallization contact on the substrate to form a collector contact.

20. The process of claim 19 wherein the step of forming the first metallization contact includes forming a platinum silicide base contact, and wherein the step of forming the second metallization contact includes forming a platinum silicide emitter contact.

21. The process of claim 14 wherein the step of forming the first semiconductor layer includes forming the first semiconductor layer doped with an n-type dopant at a concentration between 1.0E16 and 1.0E18 atoms/cm$^3$, and wherein the step of forming the second semiconductor layer includes forming the second semiconductor layer doped with boron at a concentration between 1.0E18 and 1.0E19 atoms/cm$^3$, and wherein the step of forming the third semiconductor layer includes forming the third semiconductor layer doped with an n-type dopant having a surface concentration of approximately 1.0E19 atoms/cm$^3$.

* * * * *